United States Patent [19]

Shiomi

[11] Patent Number: 5,359,553
[45] Date of Patent: Oct. 25, 1994

[54] LOW POWER ECL/MOS LEVEL CONVERTING CIRCUIT AND MEMORY DEVICE AND METHOD OF CONVERTING A SIGNAL LEVEL

[75] Inventor: Toru Shiomi, Hyogo, Japan

[73] Assignee: Mitsubishi Denki Kabushiki Kaisha, Tokyo, Japan

[21] Appl. No.: 515,304

[22] Filed: Apr. 27, 1990

[30] Foreign Application Priority Data

May 19, 1989 [JP] Japan .................. 1-127113

[51] Int. Cl.[5] ............ G11C 11/409; G11C 11/419; H03K 19/0175; H03K 19/08
[52] U.S. Cl. .................. 365/189.11; 365/189.05; 365/177; 307/475; 307/446
[58] Field of Search ............ 365/177, 189.05, 189.08, 365/230.06, 230.08, 189.11; 307/446, 570, 475

[56] References Cited

U.S. PATENT DOCUMENTS

| | | | |
|---|---|---|---|
| 4,039,862 | 8/1977 | Dingwall et al. | 307/475 |
| 4,697,109 | 9/1987 | Honme et al. | 307/475 |
| 4,710,647 | 12/1987 | Young | 307/475 |
| 4,797,583 | 1/1989 | Ueno et al. | 307/475 |

FOREIGN PATENT DOCUMENTS

| | | |
|---|---|---|
| 60-132416 | 4/1985 | Japan . |
| 60-217725 | 6/1985 | Japan . |
| 62-123825 | 7/1987 | Japan . |

*Primary Examiner*—Glenn Gossage
*Attorney, Agent, or Firm*—Lowe, Price, LeBlanc & Becker

[57] ABSTRACT

A level converting circuit comprises first and second complementary metal oxide semiconductor (CMOS) inverter circuits, and first and second N-Channel metal oxide semiconductor (NMOS) transistors. The first CMOS inverter circuit and the first transistor are connected in series between a relatively high power supply voltage and a relatively low power supply voltage. The second CMOS inverter circuit and the second NMOS transistor are connected in series between the relatively high power supply voltage and the relatively low power supply voltage. Complementary emitter coupled logic (ECL) level signals are converted into MOS level signals by the first and second CMOS inverter circuits. Current flow from the relatively high power supply voltage to the relatively low power supply voltage is inhibited by the first and second NMOS transistors. The level converting circuit can be used to interface a metal oxide semiconductor (MOS) memory cell array to a bipolar peripheral circuit.

21 Claims, 5 Drawing Sheets

LOW POWER ECL/MOS LEVEL CONVERTING CIRCUIT AND MEMORY DEVICE AND METHOD OF CONVERTING A SIGNAL LEVEL

BACKGROUND OF THE INVENTION

1. Field of the Invention

The present invention relates generally to level converting circuits, and more particularly, level converting circuits for coupling different types of logical circuits to each other and a method of converting the voltage level of a logic signal.

2. Description of the Background Art

Figure 5:
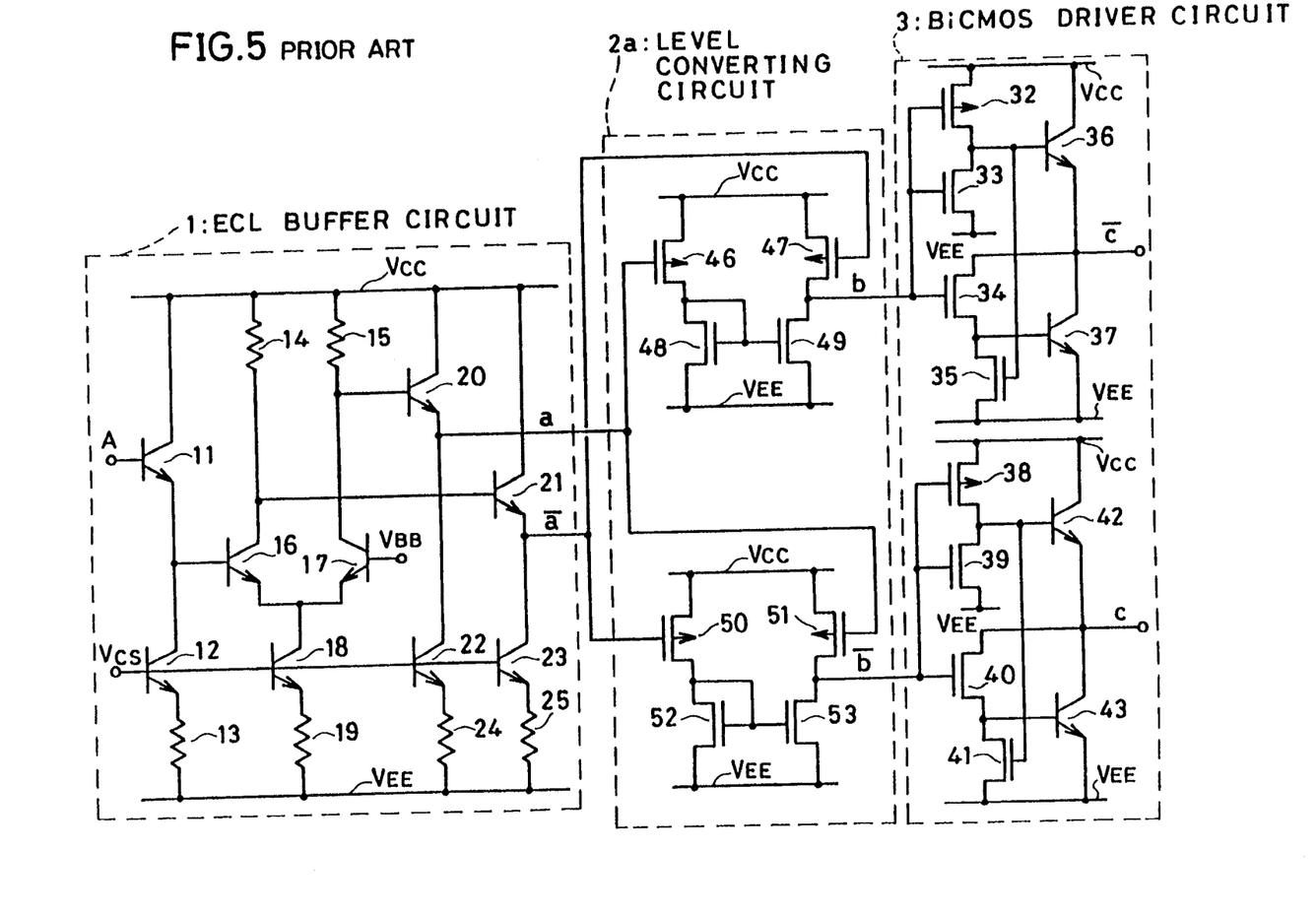
FIG. 5 is circuit diagram showing a structure of a conventional level converting circuit.

Various level converting circuits have been developed for coupling an ECL (emitter coupled logic) circuit capable of a high speed operation and a CMOS (complementary metal oxide semiconductor) circuit of a small power consumption. FIG. 5 is a circuit diagram showing one example of a conventional level converting circuit for converting a signal of an ECL level to a signal of an MOS level. The level converting circuit of FIG. 5 is described in Japanese Patent Laying Open No. 60-132416, No. 62-123825 and the like.

In FIG. 5, an ECL buffer circuit 1 comprises a bipolar ECL circuit, which receives an ECL level signal A and outputs complementary ECL level signals a and $\bar{a}$. A level converting circuit 2a comprises two current mirror circuits, which receive the complementary signals a and $\bar{a}$ of the ECL level and supply MOS level complementary signals b and $\bar{b}$. A bipolar-CMOS (BiCMOS) driver circuit 3 comprises a composite of a bipolar transistor and a CMOS circuit, and is used for increasing a driving capability of the complementary signals b and $\bar{b}$ outputted from the level converting circuit 2a.

The ECL buffer circuit 1 is comprised of an ECL input circuit portion including NPN transistors 11 and 12, and a resistance 13, a current switching portion including resistances 14, 15 and 19, and NPN transistors 16, 17 and 18, and an ECL output circuit portion including NPN transistors 20, 21, 22 and 23, and resistances 24 and 25.

The above described structure of the ECL buffer circuit is disclosed in Japanese Patent Laying Open No. 60-217725.

Normally, a relatively high power supply voltage $V_{CC}$ is set to 0 V, and a relatively low power supply voltage $V_{EE}$ is set to $-4.5$ V or $-5.2$ V. A signal A of the ECL level is applied to a base of the NPN transistor 11. The "H" level of the signal A is $-0.9$ V, and the "L" level thereof is $-1.7$ V. The signals a and $\bar{a}$ of the ECL level are respectively outputted from respective emitters of the NPN transistors 20 and 21 which are emitter follower transistors. The "H" level of the signals a and $\bar{a}$ attains a level of about $-0.8$ V which is equal to a level where the power supply voltage $V_{CC}$ is less by the amount of a base-emitter voltage $V_{BE}$ of the emitter follower transistors 20, 21. The "L" level $V_L$ of the signals a and $\bar{a}$ will be obtained by the following equation, $$V_L = V_{CC} - I \cdot R - V_{BE} \quad (1)$$

wherein I is a value of a current flowing through the resistance 14 or 15, and R is a resistance value of the resistance 14 or 15. A reference voltage $V_{BB}$ is applied to a base of the NPN transistor 17. An input threshold is set by the reference voltage $V_{BB}$. A reference voltage $V_{CS1}$ is applied to bases of the NPN transistors 12, 18, 22 and 23. Current values of the current switching portion and the ECL output circuit portion are set by the reference voltage $V_{CS1}$.

The level converting circuit 2a is comprised of a first current mirror circuit including P-channel metal oxide semiconductor (PMOS) transistors 46 and 47 and, N-channel metal oxide semiconductor (NMOS) transistors 48 and 49, and a second current mirror including PMOS transistors 50 and 51 and NMOS transistors 52 and 53. The signal a is applied to gates of the PMOS transistors 46 and 51, and the signal $\bar{a}$ is applied to gates of the PMOS transistors 47 and 50. The signal b of the MOS level is supplied from a connection point between the PMOS transistor 47 and the NMOS transistor 49, and the signal $\bar{b}$ of the NMOS level is outputted from a connection point between the PMOS transistor 51 and the NMOS transistor 53. The "H" level of the signals b and $\bar{b}$ is the power supply voltage $V_{CC}$, and the "L" level thereof is the power supply voltage $V_{EE}$.

The BiCMOS driver circuit 3 is comprised of a first CMOS inverter including a PMOS transistor 32 and an NMOS transistor 33, a second CMOS inverter including a PMOS transistor 38 and an NMOS transistor 39, a first base control circuit including NMOS transistors 34 and 35, a second base control circuit including NMOS transistors 40 and 41, and NPN transistors 36, 37, 42 and 43. The NPN transistors 36 and 37 and the NPN transistors 42 and 43 are series connected between the relatively high power supply voltage $V_{CC}$ and the relatively low power supply voltage $V_{EE}$ as shown in FIG. 5.

The first CMOS inverter drives the NPN transistor 36 and the second CMOS inverter drives the NPN transistor 42. The first base control circuit controls a base current of the NPN transistor 37, and the second base control circuit controls a base current of the NPN transistor 43. A signal $\bar{C}$ of the BiCMOS level is outputted from a connection point between the NPN transistor 36 and the NPN transistor 37, and a signal C of the BiCMOS level is outputted from a connection point between the NPN transistor 42 and the NPN transistor 43. The "H" level of the signals $\bar{C}$ and is $-0.4$ V, and the "L" level thereof is $-4.1$ V or $-4.8$ V.

Now, description will be given of operation of the circuit of FIG. 5 in which the signal A of the ECL level changes from the "H" level ($-0.9$ V) to the "L" level ($-1.7$ V).

When the signal A of the ECL level applied to the base of the NPN transistor 11 changes from the "H" level to the "L" level, a collector potential of the NPN transistor 16 changes from the "L" level to the "H" level, and on the contrary, a collector potential of the NPN transistor 17 changes from the "H" level to the "L" level, whereby an emitter potential of the NPN transistor 21 (signal $\bar{a}$) changes from the "L" level to the "H" level, and on the contrary, an emitter potential of the NPN transistor 20 (signal a) changes from the "H" level to the "L" level. As described above, the "H" level of the signal a and $\bar{a}$ is a level of about $-0.8$ V which is lowered from the power supply voltage $V_{CC}$ by the amount of base-emitter voltage $V_{BE}$ of the emitter follower transistor. The "L" level of the signals a and $\bar{a}$ can be obtained by the above described equation (1). If an amplitude of an output of the current switching portion is represented as 1 V, the "L" level of the signal a and $\bar{a}$ will be $-1.8$ V.

Since the signal $\bar{a}$ changes from the "L-" level to the "H" level and the signal a changes from the "H" level to the "L" level as described above, the PMOS transistors 46 and 51 are turned on and the PMOS transistors 47 and 50 are turned off. In addition, the NMOS transistor 49 is turned on and the NMOS transistor 53 is turned off. Accordingly, the signal $\bar{b}$ outputted from the level converting circuit 2a changes from the "L" level (power supply voltage $V_{EE}$) to the "H" level (power supply voltage $V_{CC}$), and the signal b changes from the "H" level (power supply voltage $V_{CC}$) to the "L" level (power supply voltage $V_{EE}$). These signals b and $\bar{b}$ are of the MOS level. Accordingly, they are converted from the ECL level to the MOS level.

Since the level converting circuit 2a is comprised of the MOS transistors, its driving capability is limited. Accordingly, the driving capability is increased by BiCMOS driver circuit 3. When the signal $\bar{b}$ changes from the "L" level (power supply voltage $V_{EE}$) to the "H" level (power supply voltage $V_{CC}$), the PMOS transistor 38 is turned off, and the NMOS transistors 39 and 40 are turned on, whereby the NMOS transistor 41 is turned off. Accordingly, the NPN transistor 42 is turned off and the NPN transistor 43 is turned off. As a result, the signal C outputted from the BiCMOS driver circuit 3 attains the "L" level ($V_{EE}$ +0.4 V).

On the other hand, as described above, when the signal b changes from the "H" level (power supply voltage $V_{CC}$) to the "L" level (power supply voltage $V_{EE}$), PMOS transistor 32 is turned on, and NMOS transistors 33 and 34 are turned off, so that NMOS transistor 35 is turned off. Accordingly, NPN transistor 36 is turned on, and NPN transistor 37 is turned off. As a result, the signal $\bar{C}$ supplied by BiCMOS driver circuit 3 attains the "H" level ($V_{CC}$ −0.4 V).

When ECL signal A changes from the "L" level to the "H" level, signal $\bar{a}$ attains an ECL "L" level and signal a attains "H" level by the same operation. Therefore, the signal $\bar{b}$ attains the "L" level of the MOS level, and the signal b attains the "H" level of the MOS level. In addition, the signal $\bar{C}$ attains the "L" level of the BiCMOS level, and the signal C attains the "H" level of the BiCMOS level.

As the foregoing, a logical level is converted between the ECL circuit and the MOS circuit.

However, in the above described conventional level converting circuit, two pairs of MOS current mirror circuits are required in order to obtain complementary signals of the MOS level. Therefore, a layout area is increased. In addition, increase of a size of a transistor constituting a MOS current mirror circuit for increasing the operation speed, results in increase of current consumption. For example, it is confirmed by the present inventor that in the level converting circuit 2a, if a gate width W of the PMOS transistors 46, 47, 50 and 51 is 40 μm, and a gate width W of the NMOS transistors 48, 49, 52 and 53 is 20 μm, a switching time from the inputs to the outputs b, $\bar{b}$ of the level converting circuit 2a will be about 1.1 ns whereas a current flowing through the level converting circuit 2a will be about 2.5 mA. It is also confirmed by the present inventor that in the level converting circuit 2a, if a gate width W of the PMOS transistors 46, 47, 50 and 51 is smaller, about 10 μm, and a gate width W of the NMOS transistors 48, 49, 52 and 53 is smaller, about 5 μm, a consumption current will be smaller, about 0.8 mA, whereas a switching time from the inputs to the outputs b, $\bar{b}$ of the level converting circuit 2a will be longer, about 1.5 ns.

Accordingly, if a conventional level converting circuit is used in an address buffer of a semiconductor memory device of 64K bit, the number of addresses is 16, so that a current as large as 40 mA is consumed in the level converting circuit alone. Thus, a conventional level converting circuit also has a serious problem regarding a power consumption.

SUMMARY OF THE INVENTION

An object of the present invention is to remarkably reduce a layout area in a level converting circuit, and to reduce a power consumption.

Another object of the present invention is to obtain a level converting circuit with a small layout area, requiring a small power consumption and having a larger driving capability.

A further object of the present invention is to reduce a layout area and a power consumption of a semiconductor memory device comprised of a bipolar device and a CMOS circuit.

Still another object of the present invention is to obtain a method of converting a level by which reduction of a layout area and a power consumption is possible.

Still another object of the present invention is to reduce power consumption and a layout area in a level converting circuit without reducing circuit operation speed.

A level converting circuit according to the present invention, for converting complementary signals of first and second logical levels in a first type of logical circuit into complementary signals of third and fourth logical levels in a second type of logical circuit comprises a first potential source, a second potential source, a first complementary MOS inverter circuit, a second complementary MOS inverter circuit, a first field effect device, and a second field effect device.

The first potential source applies a potential corresponding to the third logical level. The second potential source applies a potential corresponding to the fourth logical level. The first complementary MOS inverter circuit is driven by the first potential source and the second potential source, receives a signal of the first or the second logical level, and outputs a signal of the third or the fourth logical level. The second complementary MOS inverter circuit is driven by the first potential source and the second potential source, receives a signal of the second or the first logical level, and outputs a signal of the fourth or the third logical level. The first field effect device is coupled between the first complementary MOS inverter circuit and the second potential source, and is rendered non-conductive in response to a signal of the fourth logical level outputted from the second complementary MOS inverter circuit. The second field effect device is coupled between the second complementary MOS inverter circuit and the second potential source, and is rendered non-conductive in response to a signal of the fourth logical level outputted from the first complementary MOS inverter circuit.

In the level converting circuit according to the present invention, when the signal of the first logical level is converted into the signal of the third logical level by the first complementary MOS inverter circuit, the signal of the second logical level is converted into the signal of the fourth logical level by the second complementary MOS inverter circuit. The first field effect device is rendered conductive in response to the signal of the fourth logical level. Therefore, no penetrating current flows from the first potential source to the second potential source in the first complementary MOS inverter circuit.

On the contrary, when the signals of the first logical level is converted into the signal of the third logical level by the second complementary MOS inverter circuit, the signal of the second logical level is converted into the signal of the fourth logical level by the first complementary MOS inverter circuit. The second field effect device is rendered conductive in response to the signal of the fourth logical level. Therefore, no penetrating current flows from the first potential source to the second potential source in the second complementary MOS inverter circuit.

Accordingly, a power consumption is reduced. In addition, since the level converting circuit comprises only two complementary MOS inverter circuits and two field effect devices, its layout area is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in detail in the following with reference to the drawings.

Figure 1:
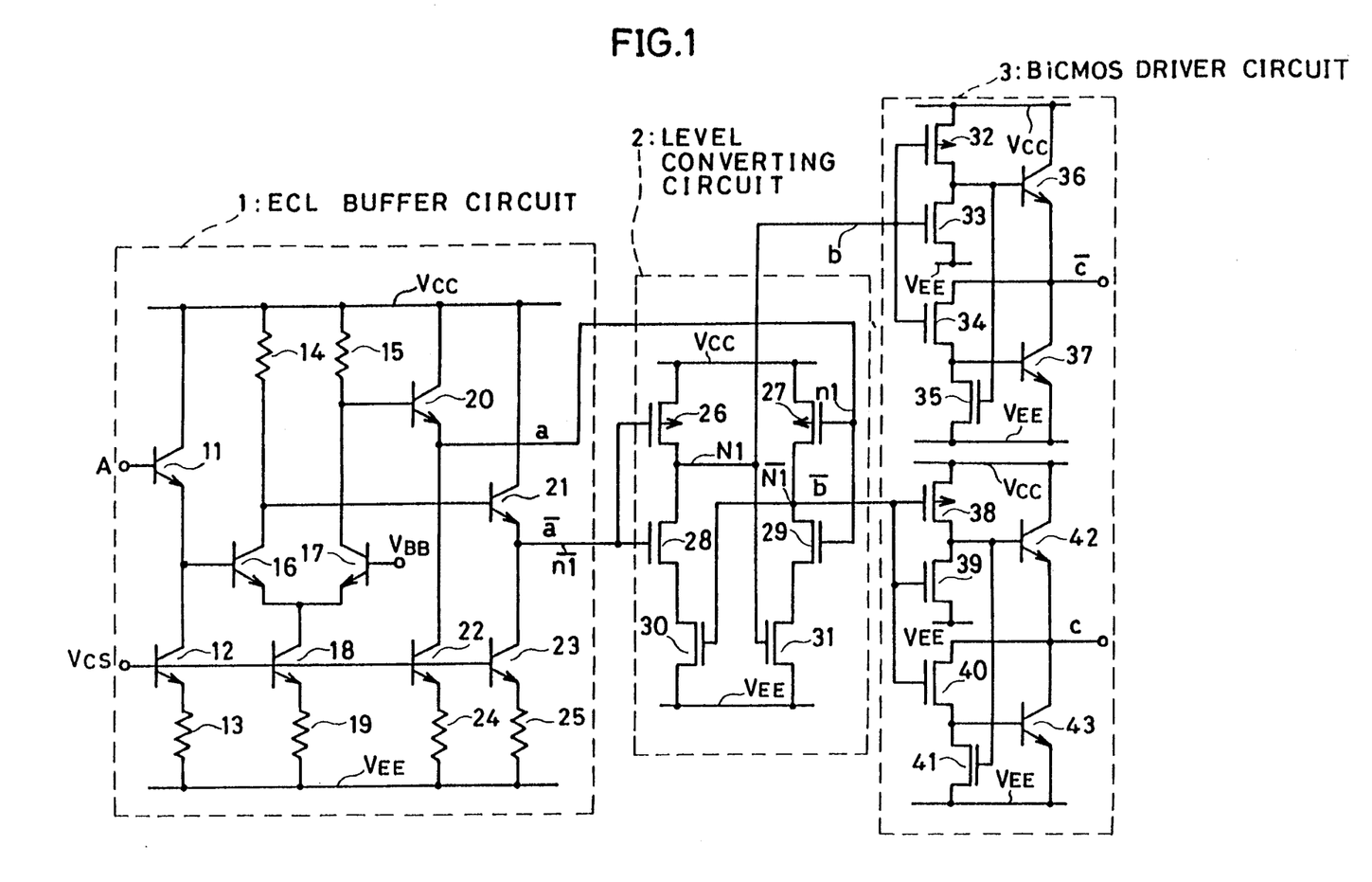
FIG. 1 is a circuit diagram showing a structure of a level converting circuit according to one embodiment of the present invention.

FIG. 1 is a circuit diagram showing a structure of a level converting circuit according to one embodiment of the present invention.

In FIG. 1, structures of an ECL buffer circuit 1 and a BiCMOS driver circuit 3 are the same as those of the ECL buffer circuit 1 and the BiCMOS driver circuit 3 shown in FIG. 5. The ECL buffer circuit 1 receives a signal A of the ECL level and outputs complementary signals a and $\bar{a}$ of the ECL level. Normally, a relatively high power supply voltage $V_{CC}$ is set to 0 V, and a relatively low power supply voltage $V_{EE}$ is set to −4.5 V or −5.2 V.

A level converting circuit 2 is a CMOS cross-coupled circuit comprising PMOS transistors 26 and 27, and NMOS transistors 28, 29, 30 and 31. The PMOS transistor 26 and the NMOS transistor 28 constitute a first CMOS inverter circuit, and the PMOS transistor 27 and the NMOS transistor 29 constitute a second CMOS inverter circuit. Gates of the PMOS transistor 26 and the NMOS transistor 28 are connected to a node $\overline{n1}$ for receiving the signal $\bar{a}$ from the ECL buffer circuit 1. Gates of the PMOS transistor 27 and the NMOS transistor 29 are connected to a node n1 for receiving the signal a from the ECL buffer circuit 1. Connection point between the PMOS transistor 26 and the NMOS transistor 28 is connected to an output node $\overline{N1}$. A connection point between the PMOS transistor 27 and the NMOS transistor 29 is connected to an output node N1. A relatively high power supply voltage $V_{CC}$ is applied to sources of the PMOS transistors 26 and 27. A relatively low power supply voltage $V_{EE}$ is applied to a source of the NMOS transistor 28 through the NMOS transistor 30. The relatively low power supply voltage $V_{EE}$ is applied to a source of the NMOS transistor 29 through the NMOS transistor 31. A gate of the NMOS transistor 30 is connected to the output node $\overline{N1}$ and a gate of the NMOS transistor 31 is connected to the output node N1. Signals b and $\bar{b}$ of the MOS level are outputted from the output nodes N1 and $\overline{N1}$, respectively. The BiCMOS driver circuit 3 receives complementary signals b and $\bar{b}$ of the MOS level, and outputs complementary signals C and $\bar{C}$ of the BiCMOS level.

Now, operation of the circuit shown in FIG. 1 will be described.

First, an operation in which the signal A of the ECL level changes from the "H" level (−0.9 V) to the to the "L" level (−1.7 V) will be described. In this case, as the ECL buffer shown in FIG. 5, the signal $\bar{a}$ changes from the "L" level to the "H" level (about −0.8 V), and on the contrary, the signal a changes from the "H" level to the "L" level (−1.8 V).

In response to signal $\bar{a}$ attaining an " H" level and signal a attaining an "L" level, PMOS transistor 26 and NMOS transistor 29 are turned off and PMOS transistor 27 and NMOS transistor 28 are turned on. As a result, the NMOS transistor 31 is turned off. Accordingly, the signal b outputted from the output node N1 changes from the "H" level to the "L" level (power supply voltage $V_{EE}$). In addition, the signal $\bar{b}$ outputted from the output node $\overline{N1}$ changes from the "L" level to the "H" level (power supply voltage $V_{CC}$).

In this case, since a potential of the node $\overline{N1}$ is about −0.8 V, the PMOS transistor 26 is fully non-conductive. Accordingly, no current flows through the first CMOS inverter circuit comprised of the PMOS transistor 26 and the NMOS transistor 28. In addition, since a potential of the node N1 is −1.8 V, the NMOS transistor 29 is not completely non-conductive. However, at that time a potential of the node N1 is lowered to the power supply voltage $V_{EE}$, the NMOS transistor 31 is completely non-conductive. Accordingly, no current flows through the second CMOS inverter circuit comprised of the PMOS transistor 27 and the NMOS transistor 29.

Thus, the level converting circuit 2 of FIG. 1 allows low power consumption. For example, it is confirmed that when the gate width W of the PMOS transistors 26 and 27 is set to 40 μm, and a gate width W of the NMOS transistors 28, 29, 30 and 31 is set to 20 μm, a current flowing through the level converting circuit 2 will be about 0.2 mA. Thus, a current flowing through the level converting circuit 2 of FIG. 1 is about 1/12 of a current flowing through the level converting circuit 2a of FIG. 5.

When the signal $\overline{b}$ attains the "H" level (power supply voltage $V_{CC}$) and the signal b attains the "L" level (power supply voltage $V_{EE}$) as described above, the signal C outputted from the BiCMOS driver circuit 3 attains the "L" level ($V_{EE}$ +0.4 V) and the signal $\overline{C}$ attains the "H level ($V_{CC}$ −0.4 V) as the BiCMOS driver circuit 3 shown in FIG. 5.

Also when the signal A of the ECL level changes from the "L" level to the "H" level, the signal $\overline{a}$ attains the "L" level of the ECL level, and the signal a attains the "H" level of the ECL level by the same operation, so that the signal $\overline{b}$ attains the "L" level of the MOS level and the signal b attains the "H" level of the MOS level. In addition, the signal $\overline{C}$ attains the "L" level of the BiCMOS level, and the signal C attains the "H" level of the BiCMOS level. The level conversion accommodates connecting an ECL circuit to an MOS circuit In the level converting circuit 2 of FIG. 1, the complementary signals b and $\overline{b}$ of the MOS level can be obtained by a pair of CMOS cross-coupled circuits, so that its layout area can be reduced. Power consumption of the circuit can also be reduced while maintaining the operation speed of the prior art.

Figure 2:
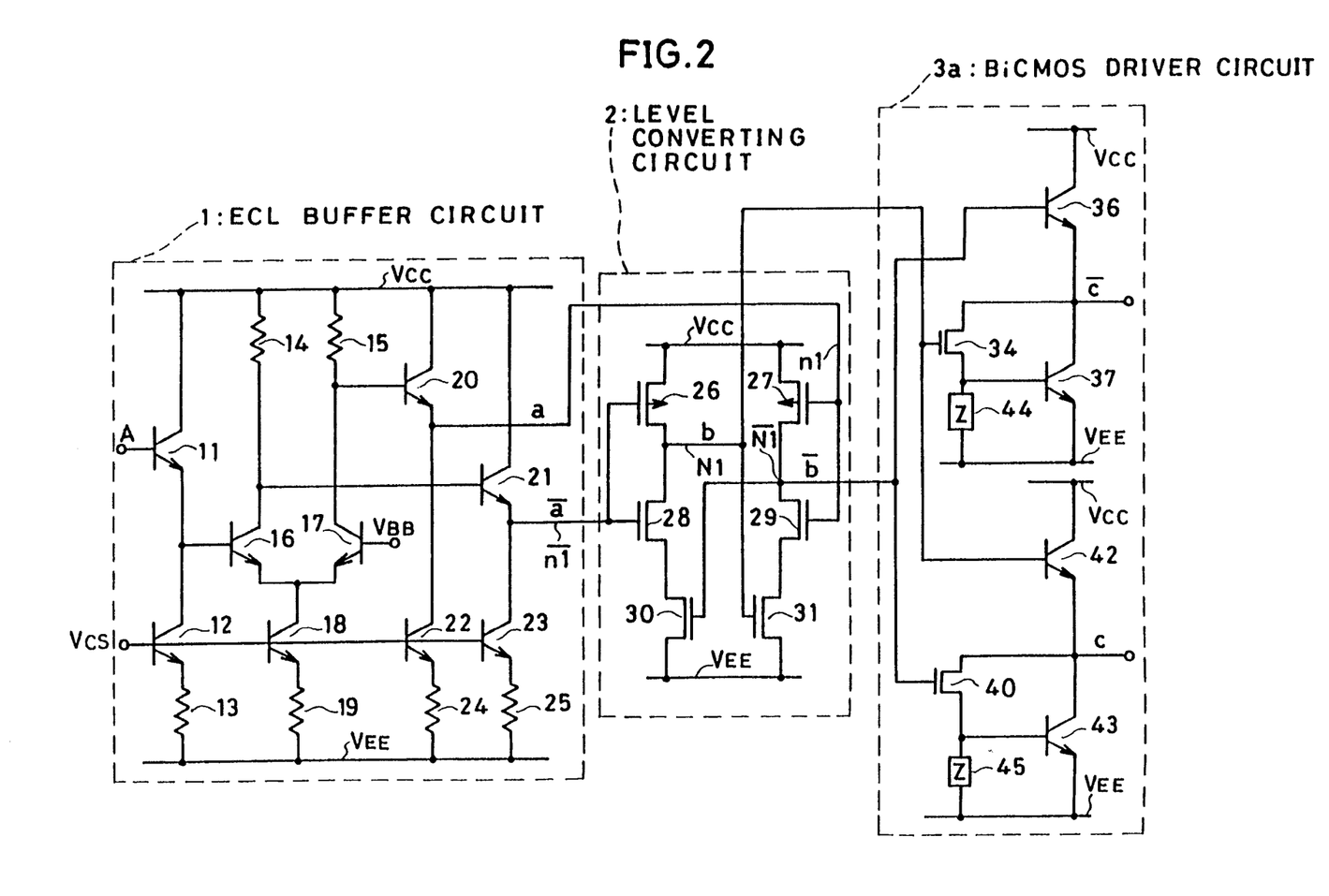
FIG. 2 is a circuit diagram showing an example in which the level converting circuit according to one embodiment of the present invention and other BiCMOS driver circuit are combined.

FIG. 2 is a circuit diagram showing a case in which the level converting circuit 2 shown in FIG. 1 and the other BiCMOS driver circuit 3a disclosed in Japanese Patent Laying-Open No. 62-123825 are combined.

In the BiCMOS driver circuit 3a shown in FIG. 2, the CMOS inverter circuit of the BiCMOS driver circuit 3 shown in FIG. 1 is not illustrated. The output nodes N1 and $\overline{N1}$ of the level converting circuit 2 are directly connected to bases of NPN transistors 36 and 42, respectively, whereby operation speed is enhanced by the amount of a delay time caused by a one-stage CMOS inverter circuit.

An impedance element 44 is coupled between a base of an NPN transistor 37 and a relatively low power supply voltage $V_{EE}$. In addition, an impedance element 45 is coupled between a base of an NPN transistor 43 and a relatively low power supply voltage $V_{EE}$. The impedance elements 44 and 45 may be either resistances or NMOS transistors.

Figure 3A:
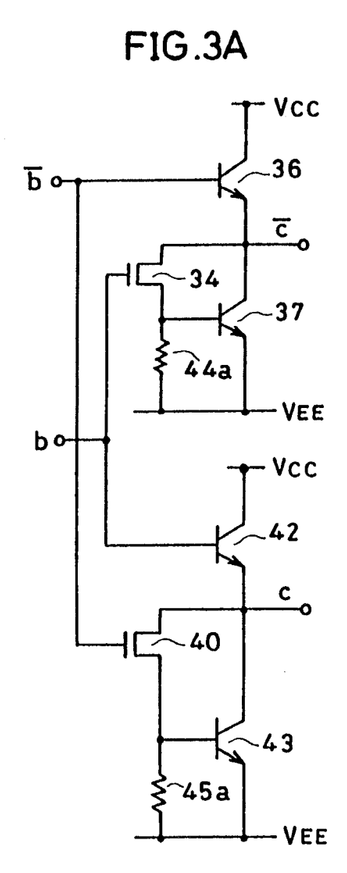
FIG. 3A is a circuit diagram showing one example of a concrete structure of the BiCMOS driver circuit shown in FIG. 2.
Figure 3B:
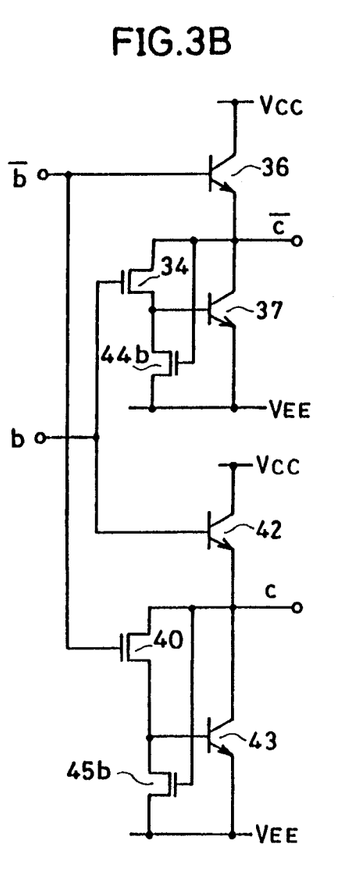
FIG. 3B is a circuit diagram showing another example of a concrete structure of the BiCMOS driver circuit shown in FIG. 2.
Figure 3C:
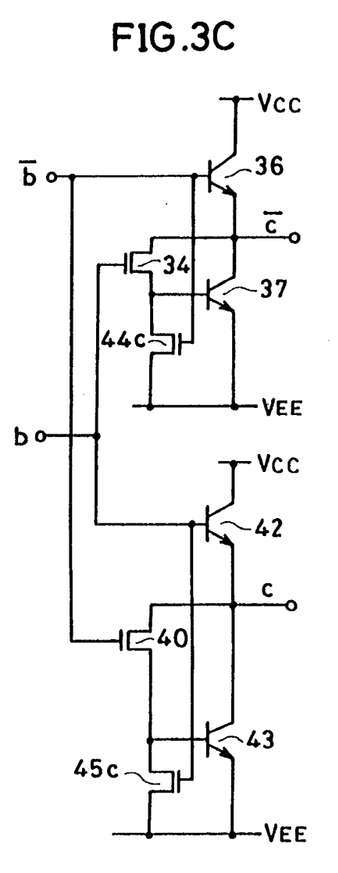
FIG. 3C is circuit diagram showing a further example of a concrete structure of the BiCMOS driver circuit shown in FIG. 2.

FIGS. 3A, 3B and 3C show three embodiments of BiCMOS driver circuit 3a including specific examples of the impedance elements 44 and 45. In the example of FIG. 3A, each of impedances 44 and 45 is comprised of resistances 44a and 45a, respectively. In the example of FIG. 3B, each of the impedance elements is comprised of NMOS transistors 44b and 45b, with the gates of the NMOS transistors 44b and 45b connected to emitters of NPN transistors 36 and 42, respectively. In the example of FIG. 3C, the impedance elements 44 and 45 comprise NMOS transistors 44c and 45c, respectively. Gates of the NMOS transistors 44c and 45c are connected to bases of the NPN transistors 36 and 42, respectively.

In the BiCMOS driver circuit 3a shown in FIG. 2, the number of elements is small, so that operation speed is enhanced and a layout area is reduced. Accordingly, by combining the level converting circuit 2 and the BiCMOS driver circuit 3a of the present invention, the operation speed is increased and the layout area is reduced.

Figure 4:
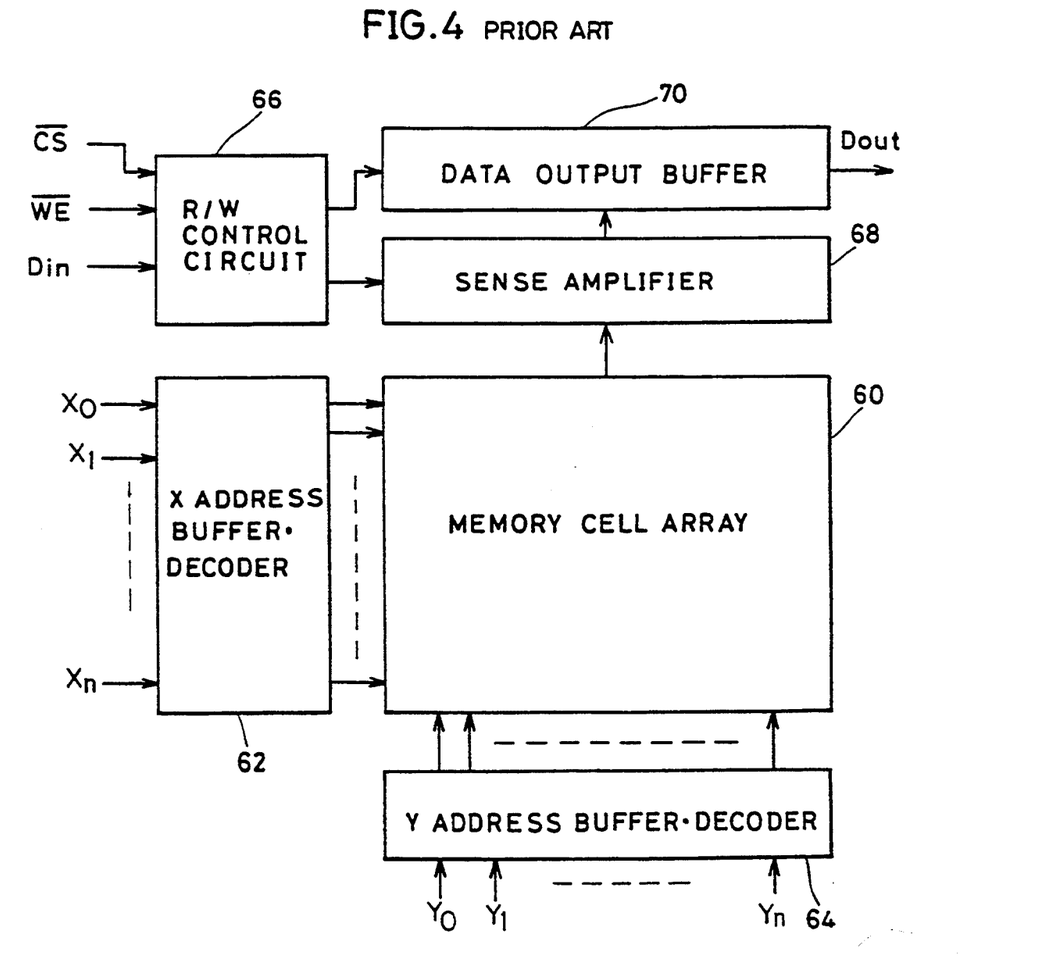
FIG. 4 is a block diagram showing a structure of RAM to which the level converting circuit of the present invention can be applied.

The level converting circuits shown in FIGS. 1 and 2 can be used, for example, for each part of BiCMOS.-RAM. The BiCMOS.RAM is developed in order to obtain a large capacity memory which can be operated at a high speed and consumes a small amount of power, and is structured by a composite of a bipolar device and a CMOS circuit. FIG. 4 shows a structure of a general RAM (Random Access Memory).

In FIG. 4, in a memory cell array 60, a plurality of word lines and a plurality of bit lines are arranged so as to intersect each other, and memory cells are provided at intersections between the word lines and the bit lines. One of the word lines in the memory cell array 60 is selected by a X address buffer decoder 62 in response to a first address signal $X_o$–$X_n$ and one of the bit lines in the memory cell array 60 is selected by a Y address buffer decoder 64 in response to a second address signal $Y_o$–$Y_n$ so that a memory cell provided at an intersection between the selected word line and the selected bit line is selected. Data is written into the selected memory cell or the data stored in the memory cell is read out. Writing or reading of the data is selected by a R/W control circuit 66. The R/W control circuit 66 operates in response to an externally applied write enable signal $\overline{WE}$ and chip select signal $\overline{CS}$.

In writing of data, an input data Din is inputted to the selected memory cell through the R/W control circuit 66. In reading of data, the data stored in the selected memory cell is detected and amplified by a sense amplifier 68, thereby being taken out to the external as an output data Dout through a data output buffer 70.

In the BiCMOS.RAM, the memory cell array is structured by a MOS transistor, and a peripheral circuit such as an address buffer decoder is structured by a bipolar transistor or a composite of a bipolar transistor and a MOS transistor.

Circuits shown in FIGS. 1 and 2 can be used for an address buffer included, for example, in the X address buffer decoder 62 and the Y address buffer decoder 64. In this case, the signal A applied to the ECL buffer circuit 1 is an address signal.

In addition, the circuits shown in FIGS. 1 and 2 can be used for the CS buffer, the WE buffer and the Din buffer included in the R/W control circuit 66. The CS buffer is a circuit for receiving the chip select signal $\overline{CS}$, the WE buffer is a circuit for receiving the write enable signal $\overline{WE}$, and the Din buffer is a circuit for receiving the input data Din.

Thus, by applying the level converting circuit shown in FIGS. 1 and 2 to the BiCMOS.RAM, the layout area and the power consumption of the memory can be reduced.

The level converting circuit of the present invention is not limited to the BiCMOS.RAM, but can be used for other various circuits requiring a level conversion.

In addition, the present invention is not limited to a level converting circuit for coupling the ECL circuit and the MOS circuit, but also can be applied to a level converting circuit for coupling other types of logical circuits to each other.

According to the present invention, since the level converting circuit is structured only by two complementary MOS inverter circuits and two field effect devices, its layout area can be remarkably reduced. In addition, no penetrating current flows through the complementary MOS inverter circuits because of operation of the field effect device, so that power consumption can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A logic level converting circuit for converting an emitter-coupled logic (ECL) level signal (A) into complementary metal oxide semiconductor (MOS) logic level signals (c,c̄), comprising:
   a first potential source node for supplying a potential (Vcc) corresponding to a first logic level (H),
   a second potential source node for supplying a potential (Vee) corresponding to a second logic level (L),
   an ECL buffer circuit (1) for receiving said ECL level signal and, in response, providing complementary first and second signals (ā, a) of third and fourth logic levels, respectively;
   a level converting circuit including
   first complementary MOS (CMOS) inverting means (26,28) coupled between said first potential source node (Vcc) and a source/drain node of a first field effect transistor (30) and receiving said first signal (ā) for providing, in response, a third signal (b) of said first or second logic level,
   second CMOS inverting means (27,29) connected between said first potential source node and a source/drain node of a second field effect transistor and receiving said second signal (a) for providing, in response, a fourth signal (b̄) of said first and second logic levels,
   said first field effect transistor (30) having a source/drain path coupled between said first CMOS inverting means (26,28) and said second potential source node, and which is rendered non-conductive in response to said fourth signal (b̄) having the second logic level (L) provided by said second CMOS inverting means (27,29), and
   said second field effect transistor (31) having a source/drain path coupled between said second CMOS inverting means (27,29) and said second potential source node, and which is rendered non-conductive in response to said third signal having the second logic level (L) provided by said first CMOS inverting means; and
   a driver circuit receiving said third and fourth signals (b,b̄) and, in response, supplying said CMOS logic level signals (c,c̄).

2. A logic level converting circuit according to claim 1, wherein said first and second logic levels comprise CMOS transistor operating voltage levels.

3. A logic level converting circuit according to claim 1, wherein said driver circuit comprises at least one bipolar transistor.

4. A logic level converting circuit according to claim 1, wherein said driver circuit comprises:
   first driver means receiving said third signal provided by said first CMOS inverting means for amplifying said third signal provided by said first CMOS inverting means, and
   second driver means receiving said fourth signal provided by said second CMOS inverting means for amplifying said fourth signal provided by said second CMOS inverting means.

5. A logic level converting circuit according to claim 4, wherein
   said first driver means comprises:
   a third output terminal,
   a first bipolar transistor having a collector-emitter current path coupled between said first potential source node and said third output terminal, and driven in response to said third signal provided by said first CMOS inverting means, and
   a second bipolar transistor having a collector-emitter current path coupled between said third output terminal and said second potential source node, and driven in response to said fourth signal provided by said second CMOS inverting means,
   said second driver means comprising:
   a fourth output terminal,
   a third bipolar transistor having a collector-emitter current path coupled between said first potential source node and said fourth output terminal, and driven in response to said third signal provided by said second CMOS inverting means, and
   a fourth bipolar transistor having a collector-emitter current path coupled between said fourth output terminal and said second potential source node, and driven in response to said fourth signal provided by said first CMOS inverting means.

6. A logic level converting circuit according to claim 1, wherein said ECL buffer circuit comprises:
   (i) an ECL input circuit portion having first and second bipolar transistors (11,12) with series connected collector-emitter paths connected between said first potential source node (Vcc) and said second potential source node (Vee) through a resistor (13), a base of said first bipolar transistor (11) receiving said ECL level signal and a base of said second bipolar transistor (12) receiving a first reference potential level (Vcs), said ECL input circuit supplying a current control signal in response to said ECL level signal and said reference potential level,
   (ii) a current switching portion (16,17,18) responsive to said current control signal and to a second reference potential (VBB) for supplying first and second currents, and
   (iii) an ECL output circuit portion (20,21,22,23) including first and second bipolar transistors (20,21) having bases respectively receiving said first and second currents and, in response, supplying said first and second complementary signals (ā,a) of said third and fourth logic levels.

7. A logic level converting circuit according to claim 1, wherein said driver circuit comprises:
   (i) first driver means (32-37) receiving said third signal (b) provided by said first CMOS inverting means (26,28,30) for amplifying said third signal and outputting the amplified third signal, and
   (ii) second driver means (38-47) receiving said fourth signal (b̄) provided by said second complementary MOS inverting means (27,29,31) for amplifying said fourth signal outputted from said second CMOS inverting means and outputting the amplified fourth signal, the amplified third and fourth signals corresponding to said CMOS logic level signals (c,c̄).

8. A logic level converting circuit according to claim 1, wherein said level converting circuit further comprises a first input terminal (n̄1) for receiving the first signal, a second input terminal (n1) for receiving second signal, and first and second output terminals (N1,N̄1),
   and wherein said first CMOS inverting means comprises:
   a first conductive channel type field effect transistor having a source/drain path coupled between said first potential source node and said first output terminal, and having a control electrode connected to said first input terminal, and a second conductive channel type field effect transistor having a source/drain path coupled between said first output terminal and a source/drain node of said first field effect transistor (30), and having a control electrode connected to said first input terminal, and wherein said second CMOS inverting means comprises:

a first conductive channel type field effect transistor having a source/drain path coupled between said first potential source node and said second output terminal, and having a control electrode connected to said second input terminal, and a second conductive channel type field effect transistor having a source/drain path connected coupled between said second output terminal and a source/drain node of said second field effect transistor (31), and having a control electrode connected to said second input terminal.

9. A logic level converting circuit according to claim 8, wherein
said first logic level is a MOS high logic level,
said second logic level is a MOS low logic level,
said first conductive channel field effect transistors in said first and second CMOS inverting means are P channel MOS transistors,
said second conductive channel type field effect transistors in said first and second CMOS inverting means are N channel MOS transistors.

10. A logic level converting circuit according to claim 9, wherein each of said first and second field effect transistors (30, 31) is an N channel MOS transistor.

11. A semiconductor memory device comprising:
a memory cell array comprising metal oxide semiconductor (MOS) transistors,
a peripheral circuit comprising bipolar transistors, and
a logic level converting circuit coupled between said memory cell array and said peripheral circuit, for converting an emitter coupled logic (ECL) level signal of first and second logic levels supplied by said peripheral circuit into complementary signals of third and fourth logic levels to be supplied to said memory cell array,
said logic level converting circuit including
(i) an ECL buffer circuit (1) receiving said ECL level signal and, in response, providing complementary first and second signals of said first and second logic levels, respectively;
(ii) a level converting circuit including
(A) a first potential source node for supplying a potential corresponding to said third logic level,
(B) a second potential source node for supplying a potential corresponding to said fourth logic level,
(C) first CMOS inverting means for receiving said first signal of said first and second logic levels to supply a third signal of said third and fourth logic levels,
(D) second CMOS inverting means for receiving said second signal of said second and first logic levels to supply a fourth signal of said fourth and third logic levels, (E) a first field effect transistor having a source/drain path coupled between said first CMOS inverting means and said second potential source node, and which is rendered non-conductive in response to said fourth signal having the fourth logical level, and (F) a second field effect transistor having a source/drain path coupled between said second inverting means and said second potential source node, and which is rendered non-conductive in response to said third signal having the fourth logical level; and (iii) a driver circuit receiving said third and fourth signals supplied by said first and second complementary CMOS inverting means, respectively, and, in response, supplying said complementary signals of said third and fourth logic levels.

12. A logic level converting circuit according to claim 11 wherein said driver circuit comprises at least one bipolar transistor.

13. A logic level converting circuit according to claim 11 wherein said ECL buffer circuit comprises:
(i) an ECL input circuit portion having first and second bipolar transistors (11,12) with series connected collector-emitter paths connected between said first potential source node (Vcc) and said second potential source node (Vee) through a resistor (13), a base of said first bipolar transistor (11) receiving said ECL level signal and a base of said second bipolar transistor (12) receiving a first reference potential level (Vcs), said ECL input circuit supplying a current control signal in response to said ECL level signal and said reference potential level;
(ii) a current switching portion (16,17,18) responsive to said current control signal and to a second reference potential (VBB) for supplying first and second currents; and
(iii) an ECL output circuit portion (20,21,22,23) including first and second bipolar transistors (20,21) having bases respectively receiving said first and second currents and, in response, supplying said complementary first and second signals (a,a) of said first and second logic levels.

14. A logic level converting circuit according to claim 11 wherein said driver circuit comprises:
(A) first driver means (32-37) receiving said third signal (b) supplied by said first CMOS inverting means (26,28,30) for amplifying said third signal and outputting the amplified third signal, and
(B) second driver means (38-47) receiving said fourth signal supplied by said second CMOS inverting means (27,29,31) for amplifying said fourth signal and outputting the amplified fourth signal, the amplified third and fourth signals corresponding to said complementary signals of said third and fourth logic levels.

15. A method of converting an emitter-coupled logic (ECL) level signal of first and second logic levels into complementary metal oxide semiconductor (CMOS) logic level signals of third and fourth logic levels, comprising:
receiving said ECL level signal and, in response to said ECL level signal, supplying a current switching signal;
supplying complementary first and second signals of said first and second logic levels in response to said current switching signal;

converting said first signal into a third signal of said third and fourth logic levels through a first complementary MOS (CMOS) inverting means coupled between a first potential source node and a second potential source node, converting said second signal into a fourth signal of said fourth and third logic levels through a second CMOS inverting means coupled between said first potential source node and said second potential source node, electrically disconnecting said first CMOS inverting means from said second potential source node in response to the fourth signal having said fourth logic level, and electrically disconnecting said second CMOS inverting means from said second potential source node in response to the third signal having said fourth logic level, and amplifying said third and fourth signals and supplying the amplified third and fourth signals as said CMOS logic level signals of said third and fourth logic levels.

16. A logic level converting circuit for converting an emitter-coupled logic (ECL) level signal (A) of first and second logic levels into complementary metal oxide semiconductor (CMOS) logic level signals of third and fourth logic levels, comprising:

a first potential source node for supplying a potential corresponding to said third logic level, a second potential source node for supplying a potential corresponding to said fourth logic level, an ECL buffer circuit (1) receiving said ECL level signal and, in response, supplying complementary first and second signals (a,ā) of said first and second logic levels;

a level converting circuit including
 (i) first complementary [metal oxide semiconductor (CMOS) inverting means for receiving said first signal of said first and second logic levels and having an output for supplying a corresponding third signal of said third and fourth logical levels,
 (ii) second CMOS inverting means for receiving said second signal, complementary to said first signal, and having an output for supplying a corresponding fourth signal of said third and fourth logic levels,
 (iii) first and second switching means in series with said first and second CMOS inverting means, respectively, and
 (iv) feedback means for providing positive feedback from the outputs of said first and second CMOS inverting means to control inputs of said second and first switching means, respectively, such that
said feedback means is connected in a cross-coupled fashion to said first and second CMOS inverting means; and a driver circuit receiving said third and fourth signals and, in response, providing said complementary CMOS logic level signals of said third and fourth logic levels.

17. A logic level converting circuit according to claim 16 wherein said driver circuit comprises at least on bipolar transistor.

18. A logic level converting circuit according to claim 16 wherein said ECL buffer circuit comprises:

an ECL input circuit portion having first and second bipolar transistors (11,12) with series connected collector-emitter paths connected between said first potential source node (Vcc) and said second potential source node (Vee) through a resistor (13), a base of said first bipolar transistor (11) receiving said ECL level signal and a base of said second bipolar transistor (12) receiving a first reference potential level (Vcs), said ECL input circuit supplying a current control signal in response to said ECL level signal and said reference potential level;

a current switching portion (16,17,18) responsive to said current control signal and to a second reference potential (VBB) for supplying first and second currents; and an ECL output circuit portion (20,21,22,23) including first and second bipolar transistors (20,21) having bases respectively receiving said first and second currents and, in response, supplying said complementary first and second signals (a,ā) of said first and second logic levels.

19. A logic level converting circuit according to claim 16 wherein said driver circuit comprises:
 (i) first driver means (32-37) receiving said third signal (b) supplied by said first CMOS inverting means (26,28,30) for amplifying said third signal outputted from said first CMOS inverting means and outputting the amplified third signal, and
 (ii) second driver means (38-47) receiving said fourth signal supplied by said second CMOS inverting means (27,29,31) for amplifying said fourth signal outputted from said second CMOS inverting means and outputting the amplified fourth signal, the amplified third and fourth signals corresponding to said complementary signals of said third and fourth logic levels.

20. A logic level converting circuit for converting one emitter-coupled logic level signal into true and complementary MOS logic level signals, comprising:

a first potential node for supplying a potential having said true MOS logic level;

a second potential node for supplying a potential having said complementary MOS logic level;

an ECL buffer circuit connected between said first and second potential nodes and receiving said one ECL level signal and outputting true and complementary ECL level signals;

a level converting circuit having a first inverting means for receiving said complementary ECL level signal and outputting said true MOS logic level signal at a first output node, a second inverting means for receiving said true ECL level signal and outputting said complementary MOS logic level signal at a second output node, a first MOS transistor having a source/drain path connected between said second potential node and said first inverting means and having a gate electrode thereof connected to said second output node, and a second MOS having a transistor connected between said second potential node and said second inverting means and having a gate electrode thereof connected to said first output node;

a first driver circuit connected between said first and second potential nodes and receiving said true MOS logic level; and a second driver circuit connected between said first and second potential node and receiving said complementary MOS logic level.

21. The circuit of claim 20, wherein said first inverting means includes a p-channel MOS transistor having a source/drain path connected between said first potential node and said first output node and an N-channel MOS transistor having a source/drain path connected between said first output node and a source/drain node of said first MOS transistor, said second inverting means having a p-channel MOS transistor having a source/drain path connected between said first potential node and said second output node and an N-channel MOS transistor having a source/drain path connected between said second output node and a source/drain node of said second MOS transistor, said first and second MOS transistors being N-channel.

* * * * *